United States Patent
Li et al.

(10) Patent No.: US 10,573,777 B2
(45) Date of Patent: Feb. 25, 2020

(54) VERTICAL STRUCTURE NONPOLAR LED CHIP ON LITHIUM GALLATE SUBSTRATE AND PREPARATION METHOD THEREFOR

(71) Applicant: South China University of Technology, Guangzhou (CN)

(72) Inventors: Guoqiang Li, Guangzhou (CN);
Wenliang Wang, Guangzhou (CN);
Zichen Zhang, Guangzhou (CN)

(73) Assignee: South China University of Technology, Guangzhou, Guangdong Province (CN)

( * ) Notice: Subject to any disclaimer, the term of this patent is extended or adjusted under 35 U.S.C. 154(b) by 0 days.

(21) Appl. No.: 16/311,818

(22) PCT Filed: Nov. 15, 2016

(86) PCT No.: PCT/CN2016/105812
§ 371 (c)(1),
(2) Date: Dec. 20, 2018

(87) PCT Pub. No.: WO2018/076406
PCT Pub. Date: May 3, 2018

(65) Prior Publication Data
US 2019/0207054 A1    Jul. 4, 2019

(30) Foreign Application Priority Data
Oct. 24, 2016   (CN) .......................... 2016 1 0925731

(51) Int. Cl.
*H01L 33/00*    (2010.01)
*H01L 33/06*    (2010.01)
(Continued)

(52) U.S. Cl.
CPC ............. *H01L 33/007* (2013.01); *H01L 33/06* (2013.01); *H01L 33/12* (2013.01); *H01L 33/32* (2013.01);
(Continued)

(58) Field of Classification Search
CPC ....... H01L 33/007; H01L 33/06; H01L 33/12; H01L 2933/0016; H01L 33/0025
(Continued)

(56) References Cited

FOREIGN PATENT DOCUMENTS

CN    101330117 A  * 12/2008
CN    101635250      1/2010
(Continued)

*Primary Examiner* — Tong-Ho Kim
(74) *Attorney, Agent, or Firm* — The Dobrusin Law Firm, PC

(57) ABSTRACT

The present invention discloses a vertical structure nonpolar LED chip on a lithium gallate substrate and a preparation method therefor. According to the method, LED epitaxial wafers are grown on a lithium gallate substrate, wherein the LED epitaxial wafers comprise a GaN buffer layer grown on the lithium gallate substrate, a non-doped GaN layer on the GaN buffer layer, an n-type doped GaN thin film on the non-doped GaN layer, an InGaN/GaN quantum well on the n-type doped GaN thin film and a p-type doped GaN thin film on the InGaN/GaN quantum well. Then, electrode patterns are prepared on the surfaces of the LED epitaxial wafers by the steps of spin coating, photoetching, developing and cleaning, and an electrode metal is sequentially deposited on the upper surfaces of the epitaxial wafers. Then, the LED epitaxial wafers are transferred to a copper substrate. Then, the original lithium gallate substrate is lifted off by an HCl solution, a silicon dioxide protective layer is prepared, and the corresponding part of an electrode is exposed. Then, $SiO_2$ on the electrode is etched away, and a complete vertical structure LED chip is formed.

10 Claims, 1 Drawing Sheet

(51) Int. Cl.
  *H01L 33/32*    (2010.01)
  *H01L 33/12*    (2010.01)
(52) U.S. Cl.
  CPC ............. *H01L 2933/0016* (2013.01); *H01L 2933/0025* (2013.01)
(58) Field of Classification Search
  USPC .......................................................... 257/79
  See application file for complete search history.

(56) References Cited

FOREIGN PATENT DOCUMENTS

| | | |
|---|---|---|
| CN | 101740673 | 6/2010 |
| CN | 102709427 | 10/2012 |
| CN | 103035789 | 4/2013 |
| CN | 103035789 A * | 4/2013 |

* cited by examiner

VERTICAL STRUCTURE NONPOLAR LED CHIP ON LITHIUM GALLATE SUBSTRATE AND PREPARATION METHOD THEREFOR

FIELD OF THE INVENTION

The present invention relates to the field of vertical structure LED chips, in particular to a vertical structure nonpolar LED chip on a lithium gallate (LiGaO$_2$) substrate and a preparation method therefor.

BACKGROUND OF THE INVENTION

As a new type of solid illumination source and environmentally friendly light source, a light-emitting diode (LED) has the characteristics of small size, low power consumption, environmental protection, long service life, high brightness, low heat and colorfulness, etc., and has a wide range of applications in outdoor lighting, commercial lighting, decorative engineering and other fields.

At present, most of the industrialized LEDs use sapphire as the substrate; however, since the sapphire itself is not electrically conductive, the current flow direction of the prepared LED chip is horizontal, that is, the prepared LED chip is a horizontal structure LED. The horizontal structure LED has been widely used due to its simple process and industrial scale. However, due to the bottleneck suppression effect on the current in the horizontal direction, the light effect of the horizontal structure LED is difficult to be improved. The corresponding vertical structure solves the problem of current distribution. The existing vertical structure has a vertical structure based on a sapphire substrate. However, a vertical structure LED chip on the sapphire substrate needs to be subjected to lifting of the substrate by laser, which not only increases the cost but also has a complicated process, often leading to a decrease in yield; besides, its application is often limited by various patents. Therefore, it is urgent to find a new type of substrate to prepare vertical structure LED chips.

CONTENTS OF THE INVENTION

In order to overcome the above shortcomings and disadvantages of the prior art, a purpose of the present invention is to provide a vertical structure nonpolar LED chip on a lithium gallate substrate and a preparation method therefor, which have the advantages of simple preparation process and satisfying current distribution of vertical structure.

The purpose of the present invention is achieved by the following technical solution:

First, LED epitaxial wafers are grown on a lithium gallate substrate, wherein the LED epitaxial wafers comprise a GaN buffer layer grown on the lithium gallate substrate, a non-doped GaN layer on the GaN buffer layer, an n-type doped GaN thin film on the non-doped GaN layer, an InGaN/GaN quantum well on the n-type doped GaN thin film and a p-type doped GaN thin film on the InGaN/GaN quantum well.

The lithium gallate substrate has a (100) plane as an epitaxial surface. The GaN buffer layer has a thickness of 30-90 nm; the non-doped GaN layer has a thickness of 100-300 nm; the n-type doped GaN film has a thickness of 1-3 μm; the InGaN/GaN quantum well is an InGaN well layer/a GaN barrier layer of 1-10 cycles, wherein the InGaN well layer has a thickness of 3-7 nm, and the GaN barrier layer has a thickness of 1-5 nm; and the p-type doped GaN film has a thickness of 100-300 nm.

Then, electrode patterns are sequentially prepared on the surfaces of the LED epitaxial wafers by the steps of spin coating, photoetching, developing and cleaning, etc., and an electrode metal is sequentially deposited on the upper surfaces of the epitaxial wafers by using an electron beam evaporation device. Then, the LED epitaxial wafers are transferred to a copper substrate by using an electroplated copper substrate transfer technique. Then, the original lithium gallate substrate is lifted off by an HCl solution of a certain concentration. A silicon dioxide (SiO$_2$) protective layer is prepared by a plasma enhanced chemical vapor deposition method, and the corresponding portion of the electrode is exposed again by the steps of spin coating, photoetching and developing, and then the SiO$_2$ on the electrode is etched away by a chemical etching method, and finally a complete vertical structure LED chip is formed.

The above preparation method for the vertical structure nonpolar LED chip on the lithium gallate substrate comprises the following steps:

(1) LED epitaxial wafers are grown on a lithium gallate substrate, wherein the LED epitaxial wafers comprise a GaN buffer layer grown on the lithium gallate substrate, a non-doped GaN layer on the GaN buffer layer, an n-type doped GaN thin film on the non-doped GaN layer, an InGaN/GaN quantum well on the n-type doped GaN thin film and a p-type doped GaN thin film on the InGaN/GaN quantum well;

(2) the LED epitaxial wafers obtained in the step (1) are ultrasonically treated sequentially in acetone, ethanol solution and deionized water, then taken out and washed with deionized water, and finally blown dry with high-purity nitrogen;

(3) the cleaned LED epitaxial wafers are coated with a photoresist, then placed in a lithography machine for exposure, and finally immersed in a developing solution;

(4) electrode preparation for the LED epitaxial wafers: the photoresist-coated LED epitaxial wafers obtained in the step (3) are placed in an electron beam evaporation device, then the evaporation chamber of the device is evacuated, and then electrode metal is sequentially vapor-deposited on the LED epitaxial wafers, and finally the LED chips are annealed;

(5) substrate transfer for the LED epitaxial wafers: the epitaxial wafers with the prepared electrode are ultrasonically treated sequentially in acetone, absolute ethanol and deionized water, then taken out and washed with deionized water, and then placed in sulfuric acid for sample activation, and finally placed in a copper sulfate solution for electroplating;

(6) the original lithium gallate substrate is etched and lifted off by using an HCl solution;

(7) preparation of a silicon dioxide protective layer by using a plasma enhanced chemical vapor deposition method: a SiO$_2$ protective layer is deposited on the surfaces of the LED chips obtained in the step (6), and then a mask plate is prepared on the surfaces of the LED chips by the steps of spin coating, exposing and developing, etc., such that the SiO$_2$ on the electrode pattern is exposed; and (8) a wet etching method is used to etch away the exposed SiO$_2$, and finally the LED chip is immersed in a de-photoresist solution to obtain the vertical structure nonpolar LED chip on the lithium gallate substrate.

Preferably, the lithium gallate substrate in the step (1) has a (100) plane as an epitaxial surface; the GaN buffer layer has a thickness of 30-90 nm; the non-doped GaN layer has a thickness of 100-300 nm; the n-type doped GaN film has a thickness of 1-3 μm; the InGaN/GaN quantum well is an InGaN well layer/a GaN barrier layer of 1-10 cycles, wherein the InGaN well layer has a thickness of 3-7 nm, and the GaN barrier layer has a thickness of 1-5 nm; and the p-type doped GaN film has a thickness of 100-300 nm.

Preferably, the ultrasonic treatment time in the steps (2) and (5) is 5-15 min.

Preferably, the thickness of the photoresist in the step (3) is 0.1-1 μm, the exposure time is 0.1-1 s, and the immersion time is 150-250 min.

Preferably, in the step (4), the evaporation chamber of the device is evacuated to $(1-5)\times10^{-5}$ Pa, the annealing temperature is 300° C. to 500° C., and the annealing time is 150-250 min.

Preferably, the concentration of the sulfuric acid in the step (5) is 10-30 wt %, the concentration of the copper sulfate solution is 100-200 g/L, and the electroplating time is 4-6 h.

Preferably, the concentration of the HCl solution in the step (6) is 10-50 wt %, and the etching time is 1-3 h.

Preferably, during the $SiO_2$ protective layer is deposited on the surfaces of the LED chips in the step (7), the degree of vacuum is $(1-5)\times10^{-5}$ Pa, and the deposition time is 50-150 min.

Preferably, the immersion time in the step (8) is 100-300 min.

The vertical structure nonpolar LED chip on the lithium gallate substrate is prepared by the above method.

The present invention has the following advantages and benefits compared to the prior art:

(1) The present invention uses lithium gallate as a substrate, which has good electric conductivity compared to a sapphire substrate and facilitates preparation of a vertical structure LED chip.

(2) The present invention uses lithium gallate as a substrate, and the prepared vertical structure LED chip is subjected to substrate transfer by using an electroplating copper method as compared with a sapphire substrate lifted off by laser, significantly reducing the manufacturing costs of LED chips.

(3) The present invention adopts lithium gallate as a substrate having low lattice mismatch and thermal mismatch with GaN, which can effectively reduce thermal stress, reduce formation of dislocations, prepare a high quality GaN film, be conducive to improving the radiation recombination efficiency of carriers, and greatly improve the luminous efficiency of nitride devices such as semiconductor lasers, light-emitting diodes and solar cells.

DETAILED DESCRIPTION OF THE EMBODIMENTS

Figure 1:
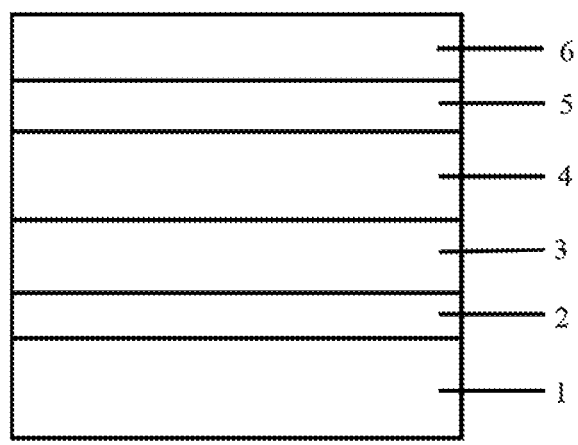
FIG. 1 is a schematic cross-sectional view of an LED chip prepared in Example 1.

The present invention will be further described in detail with reference to examples, but the embodiments of the present invention are not limited thereto.

Example 1

The preparation method for the vertical structure nonpolar LED chip on the lithium gallate substrate comprises the following steps:

(1) A pulsed laser deposition process is used to grow LED epitaxial wafers on a lithium gallate substrate, wherein the LED epitaxial wafers comprise a GaN buffer layer grown on the lithium gallate substrate, a non-doped GaN layer on the GaN buffer layer, an n-type Si-doped GaN thin film on the non-doped GaN layer with a doping concentration of $1.0\times10^9$ $cm^{-3}$, an InGaN/GaN quantum well on the n-type doped GaN thin film, and a p-type Mg-doped GaN thin film on the InGaN/GaN quantum well with a doping concentration of $1.0\times10^{17}$ $cm^{-3}$. The lithium gallate substrate has a (100) plane as an epitaxial surface. The GaN buffer layer has a thickness of 30 nm; the non-doped GaN layer has a thickness of 100 nm; the n-type Si-doped GaN film has a thickness of 1 m; the InGaN/GaN quantum well is an InGaN well layer/a GaN barrier layer of 10 cycles, wherein the InGaN well layer has a thickness of 3 nm, and the GaN barrier layer has a thickness of 1 nm; and the p-type Mg-doped GaN film has a thickness of 100 nm.

(2) The LED epitaxial wafers are ultrasonically treated sequentially in acetone for 5 min, in absolute ethanol for 5 min and in deionized water for 5 min, then taken out and washed with deionized water, and finally blown dry with high-purity nitrogen.

(3) A positive photoresist of Model RZJ304 with a thickness of 0.1 μm is applied to the cleaned LED epitaxial wafers, then the photoresist-coated epitaxial wafers are placed in a lithography machine for exposure for 0.1 s, and finally the exposed epitaxial wafers are immersed in a positive developing solution of Model RZX3038 for 150 min.

(4) Electrode preparation for the LED epitaxial wafers: The LED epitaxial wafers coated with the photoresist are placed in an electron beam evaporation device, then the evaporation chamber of the device is evacuated to $1\times10^{-5}$ Pa, and then electrode metal Cr/Pt/Au is sequentially vapor-deposited on the LED epitaxial wafers, and finally the LED chips are annealed at an annealing temperature of 300° C. for an annealing time of 150 min.

(5) Substrate transfer for the LED epitaxial wafers: The epitaxial wafers provided with the electrode are ultrasonically treated sequentially in acetone for 5 min, in absolute ethanol for 5 min and in deionized water for 5 min, then taken out and washed with deionized water, and then placed in $H_2SO_4$ solution of 10 wt % for sample activation for 20 min. The epitaxial wafers are then placed in a copper sulfate solution of 100 g/L for electroplating for 6 h.

(6) The original lithium gallate substrate is subjected to corrosion lifting by using an HCl solution of 10 wt % for an etching time of 3 h.

(7) Preparation of a silicon dioxide ($SiO_2$) protective layer by using a plasma enhanced chemical vapor deposition method: A $SiO_2$ protective layer is deposited on the surface of the LED chip, during which the degree of vacuum is $1\times10^{-5}$ Pa, and the deposition time is 50 min. Then, a mask plate is prepared on the surfaces of the LED chips by the steps of spin coating, exposing and developing, such that the $SiO_2$ on the electrode pattern is exposed.

(8) A wet etching method is used to etch away the exposed $SiO_2$, and finally the LED chip is placed in a de-photoresist solution for 100 min.

Figure 2:
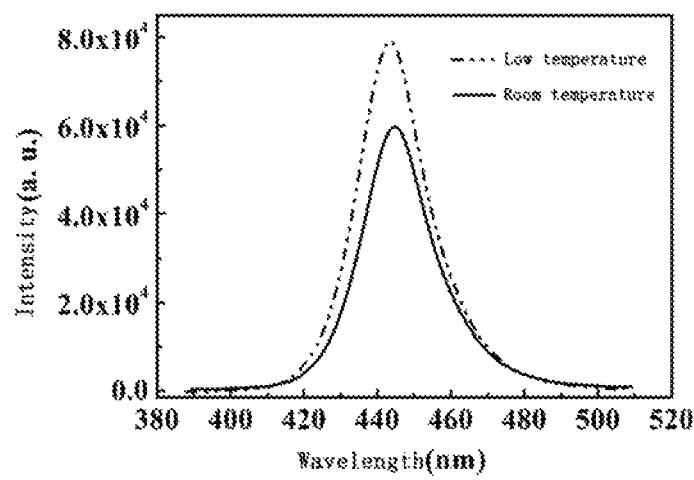
FIG. 2 is a low temperature and room temperature photoluminescence spectrum (PL) of the LED chip prepared in Example 1.
Figure 3:
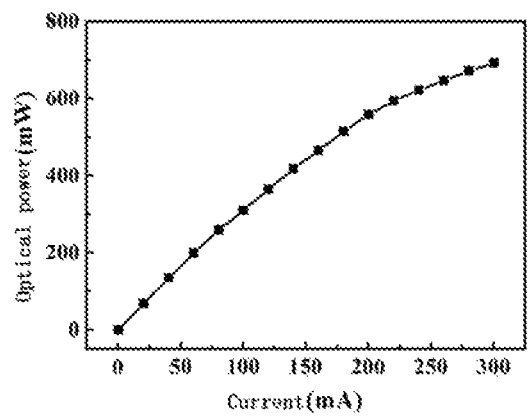
FIG. 3 is a current-optical power spectrum (L-I) of the LED chip prepared in Example 1.

As shown in FIG. 1, the vertical structure nonpolar LED chip on the lithium gallate substrate prepared in this example comprises a metal copper substrate 1, a p-type electrode layer 2 on the copper substrate 1, a p-GaN thin film layer 3 on the p-type electrode layer 2, an InGaN/GaN quantum well 4 on the p-GaN thin film layer 3, an n-GaN thin film layer 5 on the InGaN/GaN quantum well 4, and an n-type electrode and a SiO$_2$ protective layer 6 on the n-GaN thin film layer 5. As shown in FIG. 2, the LED chip prepared in this example has very good optical performance, with the half-peak breadth of the low-temperature PL spectrum at 20 nm and the half-peak breadth of the room-temperature PL spectrum at 21 nm. FIG. 3 shows the L-I spectrum of the LED with an optical power of 720 mW at 350 mA.

Example 2

The preparation method for the vertical structure nonpolar LED chip on the lithium gallate substrate comprises the following steps:

(1) A pulsed laser deposition process is used to grow LED epitaxial wafers on a lithium gallate substrate, wherein the LED epitaxial wafers comprise a GaN buffer layer grown on the lithium gallate substrate, a non-doped GaN layer on the GaN buffer layer, an n-type Si-doped GaN thin film on the non-doped GaN layer with a doping concentration of $3.0.0 \times 10^{19}$ cm$^{-3}$, an InGaN/GaN quantum well on the n-type Si-doped GaN thin film, and a p-type Mg-doped GaN thin film on the InGaN/GaN quantum well with a doping concentration of $3.0 \times 10^{17}$ cm$^{-3}$. The lithium gallate substrate has a (100) plane as an epitaxial surface. The GaN buffer layer has a thickness of 60 nm; the non-doped GaN layer has a thickness of 200 nm; the n-type Si-doped GaN film has a thickness of 2 m; the InGaN/GaN quantum well is an InGaN well layer/a GaN barrier layer of 7 cycles, wherein the InGaN well layer has a thickness of 5 nm, and the GaN barrier layer has a thickness of 3 nm; and the p-type Mg-doped GaN film has a thickness of 200 nm.

(2) The LED epitaxial wafers are ultrasonically treated sequentially in acetone for 10 min, in absolute ethanol for 10 min and in deionized water for 10 min, then taken out and washed with deionized water, and finally blown dry with high-purity nitrogen.

(3) A positive photoresist of Model RZJ304 with a thickness of 0.5 μm is applied to the cleaned LED epitaxial wafers, then the photoresist-coated epitaxial wafers are placed in a lithography machine for exposure for 0.5 s, and finally the exposed epitaxial wafers are immersed in a positive developing solution of Model RZX3038 for 200 min.

(4) Electrode preparation for the LED epitaxial wafers: The LED epitaxial wafers coated with the photoresist are placed in an electron beam evaporation device, then the evaporation chamber of the device is evacuated to $3 \times 10^{-5}$ Pa, and then electrode metal Cr/Pt/Au is sequentially vapor-deposited on the LED epitaxial wafers, and finally the LED chips are annealed at an annealing temperature of 400° C. for an annealing time of 200 min.

(5) Substrate transfer for the LED epitaxial wafers: The epitaxial wafers provided with the electrode are ultrasonically treated sequentially in acetone for 10 min, in absolute ethanol for 10 min and in deionized water for 10 min, then taken out and washed with deionized water, and then placed in H$_2$SO$_4$ solution of 20 wt % for sample activation for 30 min. The epitaxial wafers are then placed in a copper sulfate solution of 150 g/L for electroplating for 5 h.

(6) The original lithium gallate substrate is subjected to corrosion lifting by using an HCl solution of 30 wt % for an etching time of 2 h.

(7) Preparation of a silicon dioxide (SiO$_2$) protective layer by using a plasma enhanced chemical vapor deposition method: A SiO$_z$ protective layer is deposited on the surface of the LED chip, during which the degree of vacuum is $3 \times 10^5$ Pa, and the deposition time is 100 min. Then, a mask plate is prepared on the surfaces of the LED chips by the steps of spin coating, exposing and developing, such that the SiO$_2$ on the electrode pattern is exposed.

(8) A wet etching method is used to etch away the exposed SiO$_2$, and finally the LED chip is placed in a de-photoresist solution for 200 min. The performance of the LED chip prepared in this example is similar to that in Example 1, and will not be repeated here.

Example 3

The preparation method for the vertical structure nonpolar LED chip on the lithium gallate substrate comprises the following steps:

(1) A pulsed laser deposition process is used to grow LED epitaxial wafers on a lithium gallate substrate, wherein the LED epitaxial wafers comprise a GaN buffer layer grown on the lithium gallate substrate, a non-doped GaN layer on the GaN buffer layer, an n-type Si-doped GaN thin film on the non-doped GaN layer with a doping concentration of $5.0.0 \times 10^9$ cm$^{-3}$, an InGaN/GaN quantum well on the n-type Si-doped GaN thin film, and a p-type Mg-doped GaN thin film on the InGaN/GaN quantum well with a doping concentration of $5.0.0 \times 10^{17}$ cm$^{-3}$. The lithium gallate substrate has a (100) plane as an epitaxial surface. The GaN buffer layer has a thickness of 90 nm; the non-doped GaN layer has a thickness of 300 nm; the n-type Si-doped GaN film has a thickness of 3 μm; the InGaN/GaN quantum well is an InGaN well layer/a GaN barrier layer of 7 cycles, wherein the InGaN well layer has a thickness of 7 nm, and the GaN barrier layer has a thickness of 5 nm; and the p-type Mg-doped GaN film has a thickness of 300 nm.

(2) The LED epitaxial wafers are ultrasonically treated sequentially in acetone for 15 min, in absolute ethanol for 15 min and in deionized water for 15 min, then taken out and washed with deionized water, and finally blown dry with high-purity nitrogen.

(3) A positive photoresist of Model RZJ304 with a thickness of 1 μm is applied to the cleaned LED epitaxial wafers, then the photoresist-coated epitaxial wafers are placed in a lithography machine for exposure for 1 s, and finally the exposed epitaxial wafers are immersed in a positive developing solution of Model RZX3038 for 250 min.

(4) Electrode preparation for the LED epitaxial wafers: The LED epitaxial wafers coated with the photoresist are placed in an electron beam evaporation device, then the evaporation chamber of the device is evacuated to $5 \times 10^{-5}$ Pa, and then electrode metal Cr/Pt/Au is sequentially vapor-deposited on the LED epitaxial wafers, and finally the LED chips are annealed at an annealing temperature of 500° C. for an annealing time of 250 min.

(5) Substrate transfer for the LED epitaxial wafers: The epitaxial wafers provided with the electrode are ultrasonically treated sequentially in acetone for 15 min, in absolute ethanol for 15 min and in deionized water for 15 min, then taken out and washed with deionized water, and then placed in H$_2$SO$_4$ solution of 30 wt % for sample activation for 15 min. The epitaxial wafers are then placed in a copper sulfate solution of 200 g/L for electroplating for 4 h.

(6) The original lithium gallate substrate is subjected to corrosion lifting by using an HCl solution of 50 wt % for an etching time of 1 h.

(7) Preparation of a silicon dioxide (SiO$_2$) protective layer by using a plasma enhanced chemical vapor deposition method: A SiO$_2$ protective layer is deposited on the surface of the LED chip, during which the degree of vacuum is $5 \times 10^{-5}$ Pa, and the deposition time is 150 min. Then, a mask plate is prepared on the surfaces of the LED chips by the steps of spin coating, exposing and developing, such that the SiO$_2$ on the electrode pattern is exposed.

(8) A wet etching method is used to etch away the exposed SiO$_2$, and finally the LED chip is placed in a de-photoresist solution for 300 min. The performance of the LED chip prepared in this example is similar to that in Example 1, and will not be repeated here.

The above examples are preferred embodiments of the present invention, but the embodiments of the present invention are not limited thereto, and any other alterations, modifications, substitutions, combinations, and simplifications made without departing from the spirit and principle of the present invention should all be equivalent methods and included in the protection scope of the present invention.

The invention claimed is:

1. A preparation method for a vertical structure nonpolar LED chip on a lithium gallate substrate, characterized in that the method comprises following steps:
   (1) LED epitaxial wafers are grown on the lithium gallate substrate, wherein the LED epitaxial wafers comprise a GaN buffer layer grown on the lithium gallate substrate, a non-doped GaN layer on the GaN buffer layer, an n-type doped GaN thin film on the non-doped GaN layer, an InGaN/GaN quantum well on the n-type doped GaN thin film and a p-type doped GaN thin film on the InGaN/GaN quantum well;
   (2) the LED epitaxial wafers obtained in the step (1) are ultrasonically treated sequentially in an acetone, an ethanol solution and a deionized water, then taken out and washed with a deionized water, and finally blown dry with a high-purity nitrogen;
   (3) the cleaned LED epitaxial wafers are coated with a photoresist, then placed in a lithography machine for exposure, and finally immersed in a developing solution;
   (4) electrode preparation for the LED epitaxial wafers: the photoresist-coated LED epitaxial wafers obtained in the step (3) are placed in an electron beam evaporation device, then an evaporation chamber of the electron beam evaporation device is evacuated, and then an electrode metal is sequentially vapor-deposited on the LED epitaxial wafers, and finally LED chips are annealed;
   (5) substrate transfer for the LED epitaxial wafers: the epitaxial wafers with the prepared electrode are ultrasonically treated sequentially in an acetone, an ethanol solution and a deionized water, then taken out and washed with a deionized water, and then placed in a sulfuric acid for sample activation, and finally placed in a copper sulfate solution for an electroplating;
   (6) the original lithium gallate substrate is etched and lifted off by using an HCl solution;
   (7) preparation of a silicon dioxide protective layer by using a plasma enhanced chemical vapor deposition method: the SiO$_2$ protective layer is deposited on surfaces of the LED chips obtained in the step (6), and then a mask plate is prepared on the surfaces of the LED chips by steps of spin coating, exposing and developing, such that the SiO$_2$ on an electrode pattern is exposed; and
   (8) the exposed SiO$_2$ is etched away by using a wet etching method, and finally the LED chip is immersed in a de-photoresist solution to obtain the vertical structure nonpolar LED chip on the lithium gallate substrate.

2. The preparation method according to claim 1, characterized in that: the lithium gallate substrate in the step (1) has a (100) plane as an epitaxial surface; the GaN buffer layer has a thickness of 30-90 nm; the non-doped GaN layer has a thickness of 100-300 nm; the n-type doped GaN film has a thickness of 1-3 μm; the InGaN/GaN quantum well is an InGaN well layer/a GaN barrier layer of 1-10 cycles, wherein the InGaN well layer has a thickness of 3-7 nm, and the GaN barrier layer has a thickness of 1-5 nm; and the p-type doped GaN film has a thickness of 100-300 nm.

3. The preparation method according to claim 1, characterized in that: an ultrasonic treatment time in the steps (2) and (5) is 5-15 min.

4. The preparation method according to claim 1, characterized in that: a thickness of the photoresist in the step (3) is 0.1-1 μm, an exposure time is 0.1-1 s, and an immersion time is 150-250 min.

5. The preparation method according to claim 1, characterized in that: in the step (4), the evaporation chamber of the electron beam evaporation device is evacuated to $(1-5) \times 10^{-5}$ Pa, an annealing temperature is 300° C. to 500° C., and an annealing time is 150-250 min.

6. The preparation method according to claim 1, characterized in that: a concentration of the sulfuric acid in the step (5) is 10-30 wt %, a concentration of the copper sulfate solution is 100-200 g/L, and an electroplating time is 4-6 h.

7. The preparation method according to claim 1, characterized in that: a concentration of the HCl solution in the step (6) is 10-50 wt %, and an etching time is 1-3 h.

8. The preparation method according to claim 1, characterized in that: during the SiO$_2$ protective layer is deposited on the surfaces of the LED chips in the step (7), a degree of vacuum is $(1-5) \times 10^{-5}$ Pa, and a deposition time is 50-150 min.

9. The preparation method according to claim 1, characterized in that: an immersion time in the step (8) is 100-300 min.

10. A vertical structure nonpolar LED chip on a lithium gallate substrate prepared by the method of claim 1.

* * * * *